US005233136A

United States Patent [19]

Hamada

[11] Patent Number: 5,233,136

[45] Date of Patent: Aug. 3, 1993

[54] HORN LOADSPEAKER

[75] Inventor: Hiroyuki Hamada, Saitama, Japan

[73] Assignee: Pioneer Electronic Corporation, Tokyo, Japan

[21] Appl. No.: 920,709

[22] Filed: Jul. 28, 1992

[30] Foreign Application Priority Data

Sep. 4, 1991 [JP] Japan ........ 3-253015

[51] Int. Cl.[5] ........ H05K 5/00

[52] U.S. Cl. ........ 181/152; 181/182; 181/184; 181/192

[58] Field of Search ........ 181/151, 152, 155, 159, 181/160, 179, 182, 184, 187, 189, 191, 192; 381/156, 158, 159

[56] References Cited

U.S. PATENT DOCUMENTS 4,893,695 1/1990 Tamura et al. ........ 181/152 X 5,115,883 5/1992 Morikawa et al. ........ 181/152

*Primary Examiner*—Michael L. Gellner
*Assistant Examiner*—Khanh Dang
*Attorney, Agent, or Firm*—Nikaido, Marmelstein, Murray & Oram

[57] ABSTRACT

A horn loudspeaker has an opening formed in a wall of a horn, and a tubular duct is provided along the horn and communicated with the opening. The length L of the duct is expressed as, $L \simeq c/4fr - 0.4d$ where c is a velocity of sound, fr is a frequency a sound pressure of which is to be reduced, and d is an inner diameter of the duct.

6 Claims, 7 Drawing Sheets

HORN LOADSPEAKER

FIELD OF THE INVENTION

The present invention relates to a horn loudspeaker, where sound waves generated by a diaphragm propagate along a horn.

BACKGROUND OF THE INVENTION

In the horn loudspeaker, the sound waves generated by the diaphragm are gathered at a throat of the horn so as to increase sound pressure, and thereafter, propagate along the horn. Aerial resistance in the horn exerts on the diaphragm so that radiation resistance is increased, thereby improving the transmission efficiency of the speaker.

The horn loudspeaker is advantageous in that it has a high energy conversion efficiency. Hence, it is applied for various purposes such as for a home hi-fi system and a commercial public address system.

The horn loudspeaker may be sorted into a parabolic horn speaker, conical horn speaker, exponential horn speaker and hyperbolic horn speaker, each of which differs from one another in increasing rate of the cross-sectional areas of the horn.

As an example of the horn loudspeaker, a conventional exponential horn loudspeaker is described with reference to FIGS. 8*a* and 8*b* which schematically shown a basic horn speaker and an equivalent circuit of the mechanical system of the speaker. The horn speaker has a horn having a throat at an apex thereof. For the ease of explanation, the length of the horn is considered to be infinite. Opposite to the throat is disposed a diaphragm connected to a converter for converting electrical energy to sound energy. In the figure, SO is an area($m^2$) of the diaphragm, S1 is an area($m^2$) of the throat, mo is a total mass(kg) of a diaphragm device, Cm is a compliance(m/n) of a suspension of the diaphragm, and Cm' is a compliance(m/n) of air in a space between the diaphragm and the throat.

An acoustic impedance Zr for unit area(Ns/$m^3$) is expressed as $$Zr=rr+jXr$$

where rr is a radiation resistance(Ns/$m^3$) and Xr is a radiation reactance(Ns/$m^3$) for unit area. The radiation resistance rr is further expressed as $$rr = Z0\sqrt{1-(m2k)^2}$$

where ZO is a specific acoustic impedance(Ns/$m^3$) and mx is a flare constant of the horn. The radiation reactance Zr is expressed as $$Xr=ZO(m/2k)$$

FIG. 9 shows a frequency response of the radiation impedance. The radiation resistance for unit area represents a rate of energy propagating from the throat to the mouth of the horn to the entire energy.

In the conventional horn speaker, there is a problem that for good sound reproduction at low frequencies, group delay characteristics are deteriorated, and vice versa.

FIG. 10 show a relaxation time $\tau$ relative to acoustic impedance. The relaxation time $\tau$ which is expressed as $\tau_2$ Zr/rr shows a transient response of the horn. That is, when the relaxation time $\tau$ is increased, both the rise and fall of the frequency is delayed. In a low frequency range, the transient response becomes insufficient. Therefore, the sound in the transient state in the low frequency range is strengthened, thereby deadening the sound. As a result, the sound quality is deteriorated.

In addition, the sound source of the horn speaker is unstable. More particularly, a phase constant in the horn is expressed as $$\sqrt{k^2-(m/2)^2}\ .$$

A wavelength λh(m) in the horn is expressed as $$\lambda h = 2\pi/\sqrt{k^2-(m/2)^2} = \lambda/\sqrt{1-(mc/4\pi f)^2}$$
$$= \lambda/\sqrt{1-(fc/f)^2}$$

where fc is a cutoff frequency(Hz). When a given frequency f coincides with the cutoff frequency fc(f=fc), the wavelength λh is infinitely increased, so that the sound source moves.

FIG. 11 shows a ratio λh/λ between the horn wavelength λh and the free space wavelength λ. The graph indicates that the position of the sound source moves, particularly in a range where the frequency f is approximate the cutoff frequency fc.

Moreover, due to the relationship between a directional frequency response and energy characteristics, a peak appears in sound pressure frequency response, which means deterioration in smooth sound quality.

SUMMARY OF THE INVENTION

An object of the present invention is to provide a horn loudspeaker where the sound quality is improved, and the position of sound source is stabilized.

According to the present invention, there is provided a horn loudspeaker having an opening formed in a wall of a horn, and a tubular duct with closed ends, connected to the opening, wherein the length L of the duct is expressed as, $$L \simeq c/4fr-0.4d$$

where c is a velocity of sound, (n/sec) fr is a frequency, (Hz) a sound pressure of which is to be reduced, and d is an inner diameter of the duct(m).

In the horn loudspeaker of the present invention, the length L(m) of the duct is set to attenuate the sound pressure at a predetermined frequency fr by the resonance caused in the duct. When the frequency is approximate a cutoff frequency set by the horn, the sound pressure level of the frequency having a long relaxation time relative to acoustic impedance is decreased, thereby improving the transient response of the sound quality, and localizing the sound source near the throat of the horn.

The other objects and features of this invention will become understood from the following description with reference to the accompanying drawings.

DETAILED DESCRIPTION OF THE PREFERRED EMBODIMENTS

Figure 1:
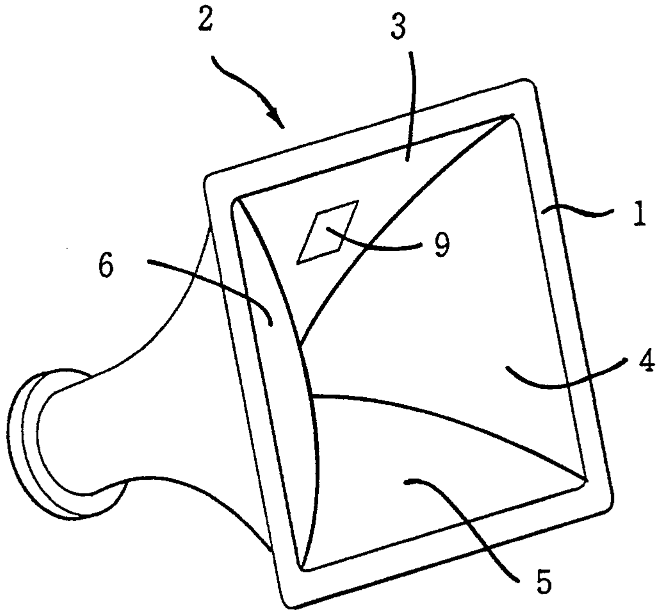
FIG. 1 is a perspective view of a horn loudspeaker according to the present invention.
Figure 2:
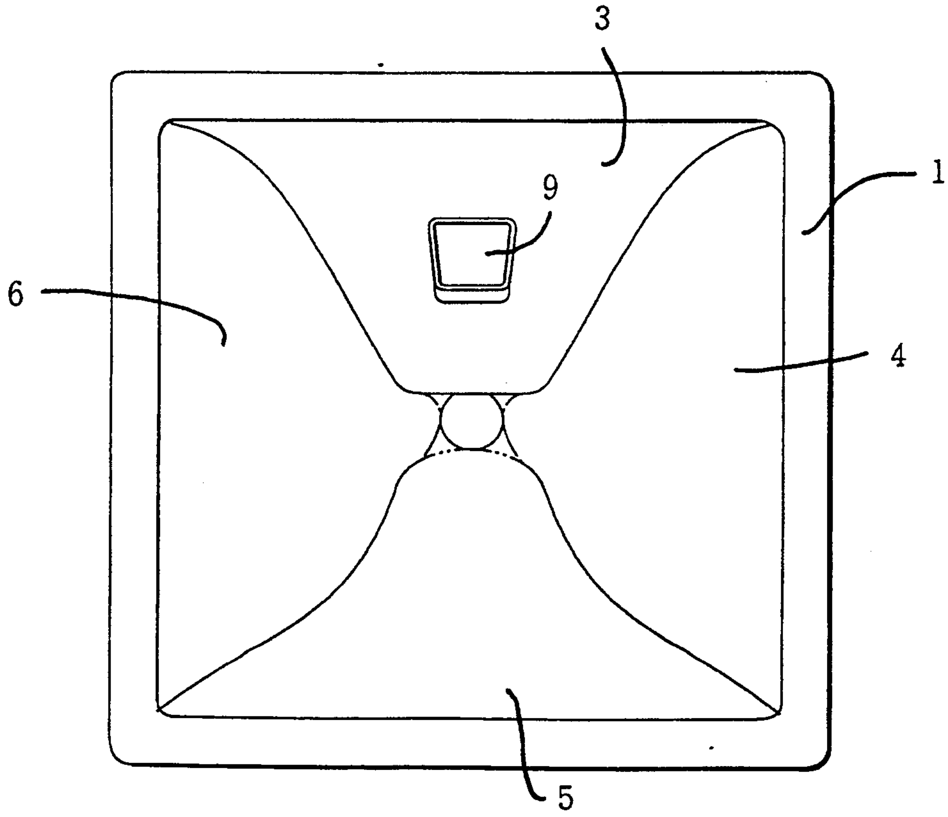
FIG. 2 is a front view of the speaker shown in FIG. 1.
Figure 3:
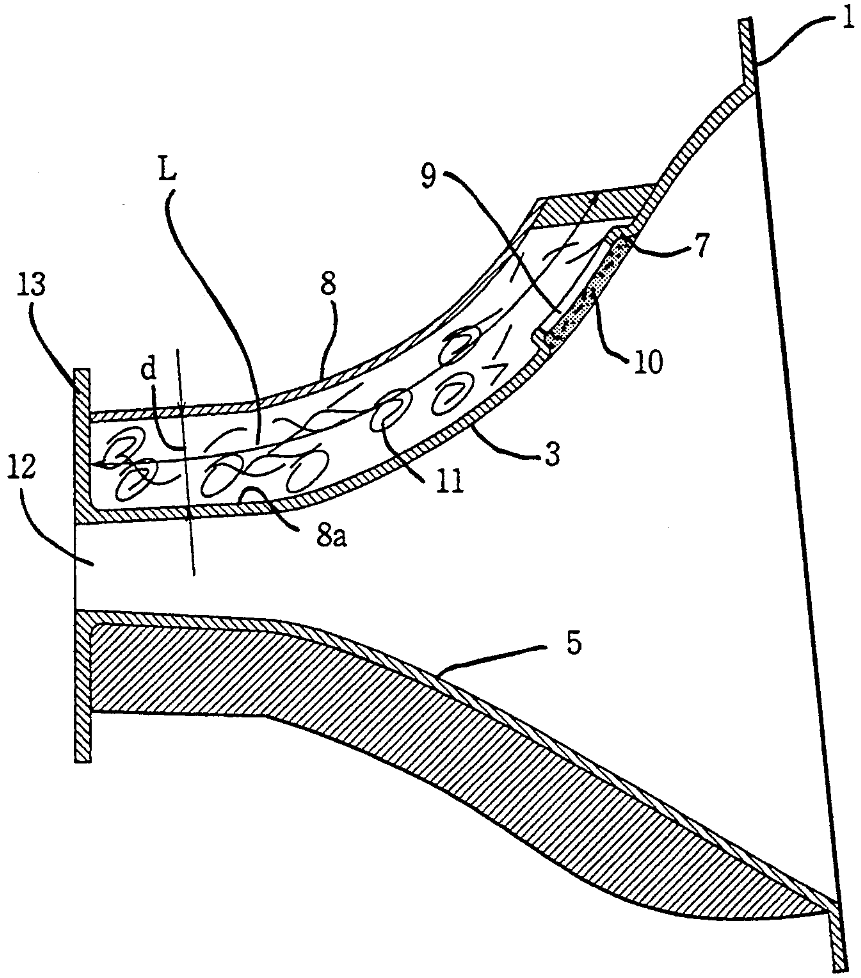
FIG. 3 is a sectional view of the speaker of FIG. 1.

Referring to FIGS. 1 to 3, a horn loudspeaker of the present invention has a horn 2 comprising side walls 3 to 6. The horn 2 has a flange 1 around the periphery of a mouth. As shown in FIG. 3, a flange 13 is formed around a throat 12 of the horn 2 for attaching a driver (not shown). A tubular duct 8 is fixed to the horn 2, along the side wall 3. The duct 8 extends in the axial direction of the speaker, and has an end secured to the flange 13 and a closed front end. An inner space 8a of the duct 8 is connected to the inner space of the horn 2 through an opening 9 formed in a recess 7 of the side wall 3. A sound absorbent 11 is disposed in the inner space 8a. A jersey net 10 is mounted across the recess 7, thereby covering the opening 9.

The effective length L(m) of the duct 8 for decreasing the sound pressure at a predetermined frequency fr(Hz) is set in accordance with the following equation, $$L \simeq (c/4fr) - 0.4d \qquad (1)$$

where c is a sound velocity(m/sec) and d is an inner diameter(m) of the duct 8, which is constant.

Figure 4:
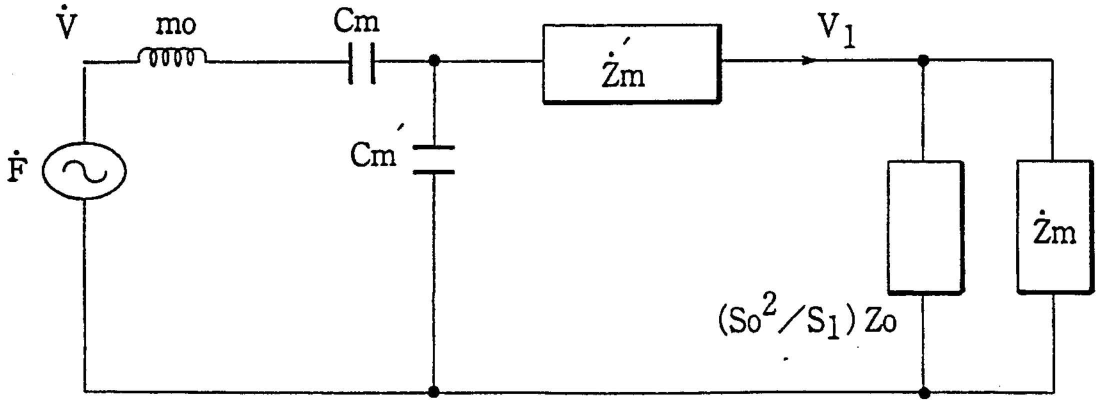
FIG. 4 is an equivalent circuit of a mechanical system of the speaker of FIG. 1.

The operation of the horn speaker provided with the duct will be described. For the ease of explanation, it is assumed that the duct 8 is tightly coupled to the horn 2. FIG. 4 is an equivalent circuit of the mechanical system of the horn speaker shown in FIG. 3.

The specific acoustic impedance ZO(Ns/m$^3$) of the duct is expressed as, $$ZO = -j\omega c.cot.k(K+0.4d)$$

The frequency fr(Hz) is expressed as, $$fr = Z(n-1)c/4(L+0.4d)$$

The acoustic impedance ZO is zero when n is 1. When the frequency fr is approximate to the cutoff frequency fc, (Hz) Vl is easily branched to the acoustic impedance of the duct. As a result, the energy branched to the acoustic reactance decreases. When the frequency fr coincides with the cutoff frequency fc, the sound pressure level which is inferior in transient response decreases. At the same time, resonant energy reduces, thereby improving transition response.

In FIG. 4, when the frequency fr is the cutoff frequency fc, the acoustic impedance ZO becomes zero, thereby rendering a motional impedance Zm also zero. Hence the acoustic impedance area which is expressed as rr+jXr is zero. The radiation resistance rr (Ns/m$^3$) is zero when the frequency fr is equal to the cutoff frequency fc. Thus, $$Xr = ZO(m/2k) = 0$$

where ZO≠and k≠O. Hence m=0(rad/m). When m=0(rad/m) is substituted in the equation (1) for obtaining the phase constant, $$\lambda h = \lambda$$

Thus, when the frequency fr is the cutoff frequency fc, the wavelength λH is the horn coincides with the wavelength in free space so that a center of the wavefront thereof is clearly set at the throat, thereby stabilizing the sound source position.

Figure 11:
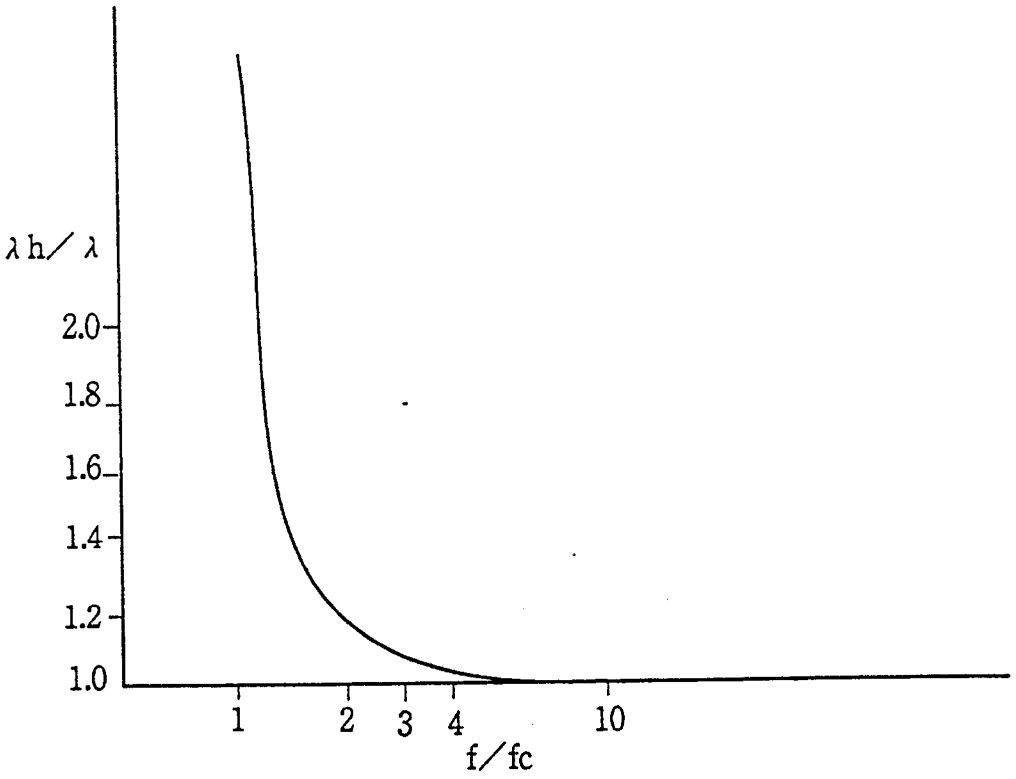
FIG. 11 is a graph showing a ratio between wavelengths in the horn and in the free space.

The transient response and the stability of the sound source are also achieved with a horn where the absorbent 11 is provided in the duct 8. The absorbent 11 is for decreasing the Q-value in the duct. Although the effect in the sound pressure at the cutoff frequency may slightly reduce, resonance resulting in the duct operates to decrease the acoustic impedance in the duct. Thus a high value part of the ratio λh/λ shown in FIG. 11 can be largely decreased.

In addition, since the resonance energy is converted into heat energy in a short time by the absorbent, unnecessary resonant sounds generated in the duct is decreased.

Figure 5:
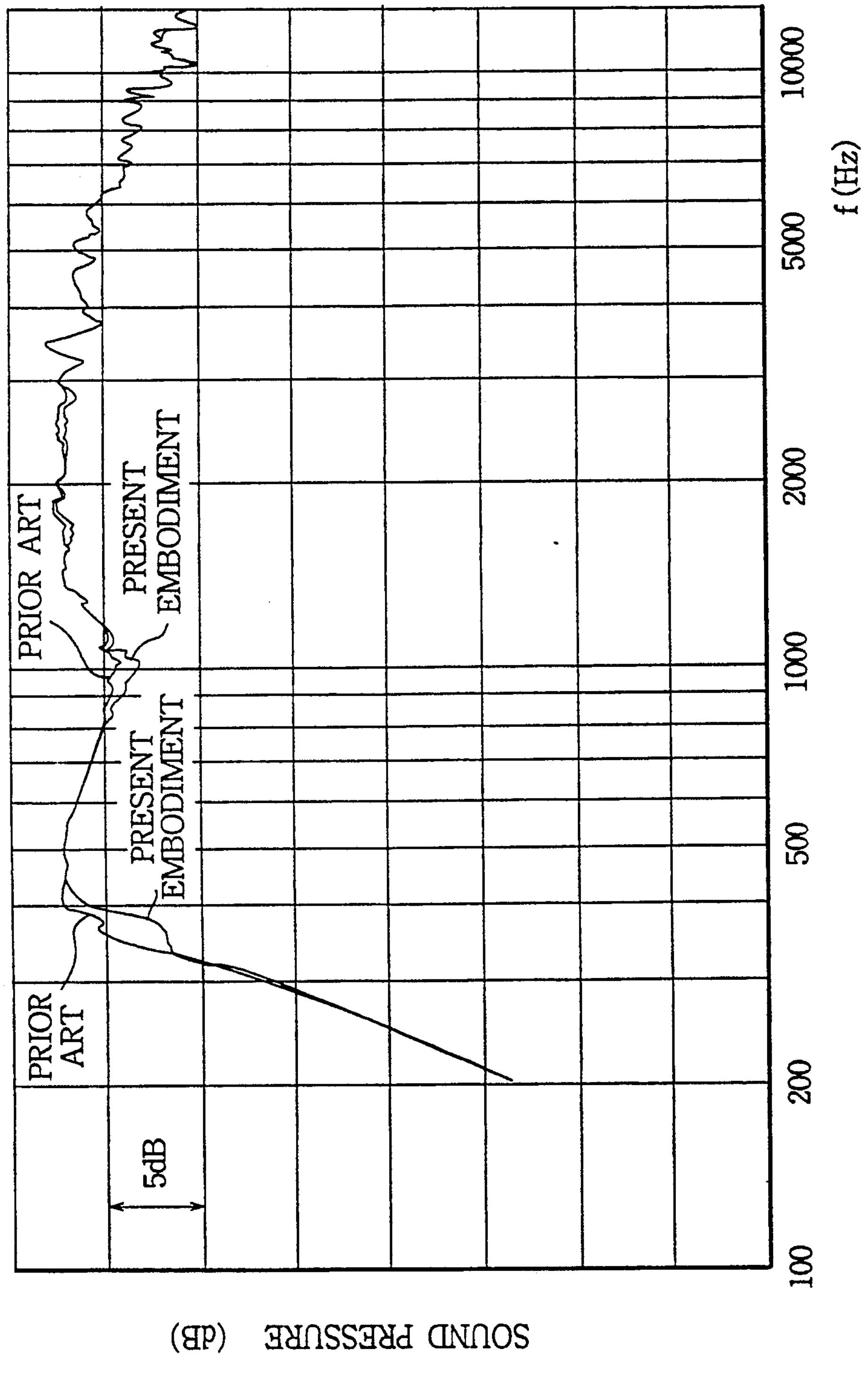
FIG. 5 is a graph showing sound pressure characteristics of the horn speaker of the present invention.
Figure 6:
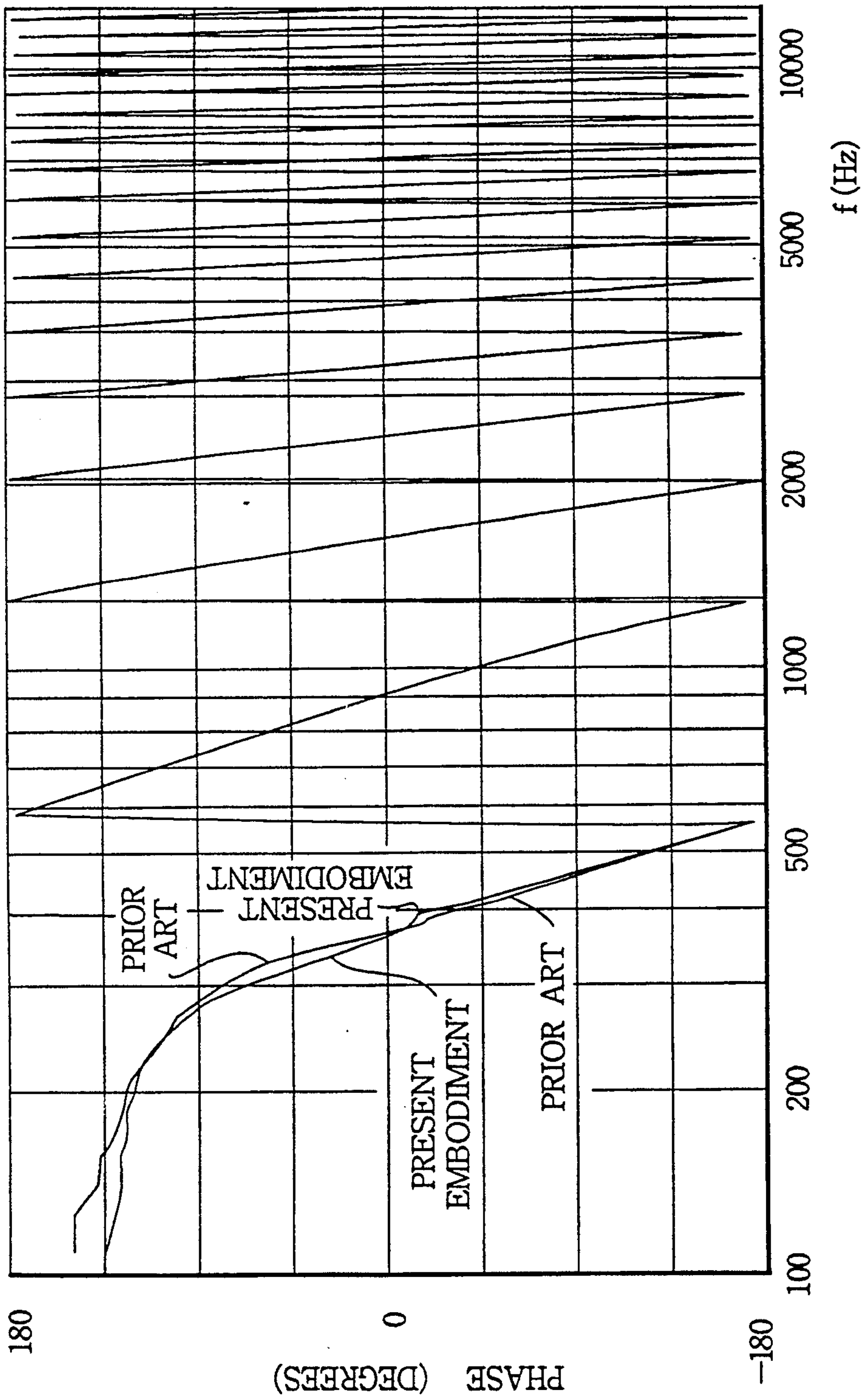
FIG. 6 is a graph showing phase characteristics of the speaker of the present invention.

A frequency response on the axis of the horn 2 is shown in FIG. 5. In the speaker of the present invention having the duct 8, sound pressure level in a low frequency range between 300 Hz and 400 Hz is attenuated compared to that in a conventional speaker. 5 As shown in FIG. 6 where phase-frequency characteristics of the present and conventional horn speakers are shown, in the range of 300 Hz to 400 Hz, the rotation of the phase characteristic is decreased, that is the group delay is restrained.

The present invention may be modified to provide the duct 8 on each of the side walls 3 to 6. Each dimension of the inner space 8a of the duct 8 is determined to absorb sound at different frequency. Thus attenuating range of the sound pressure levels may be extended, thereby improving the sound quality.

Figure 7A:
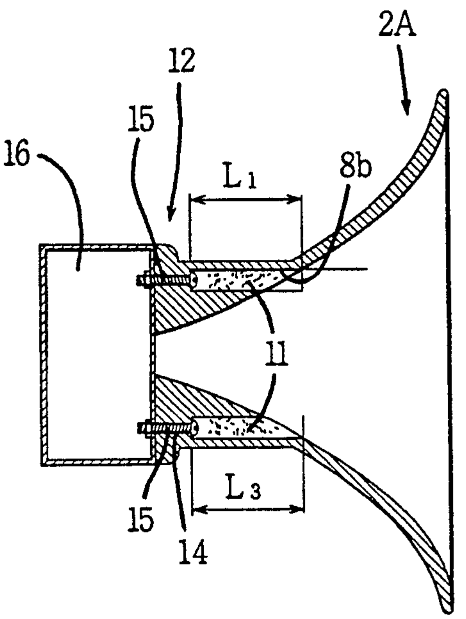
FIGS. 7a and 7b show a sectional view and a side elevational view of a second embodiment of the present invention, respectively.
Figure 7B:
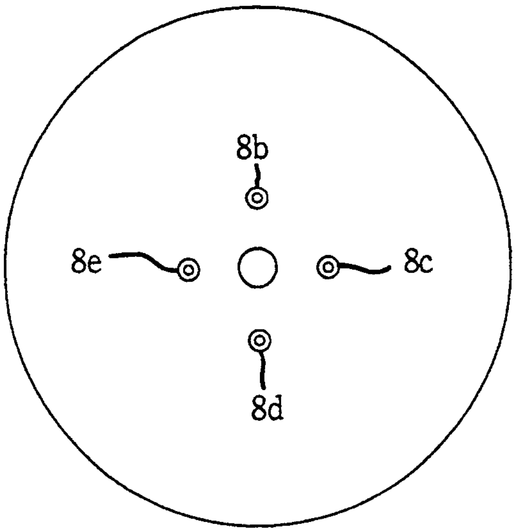
Figure 8:
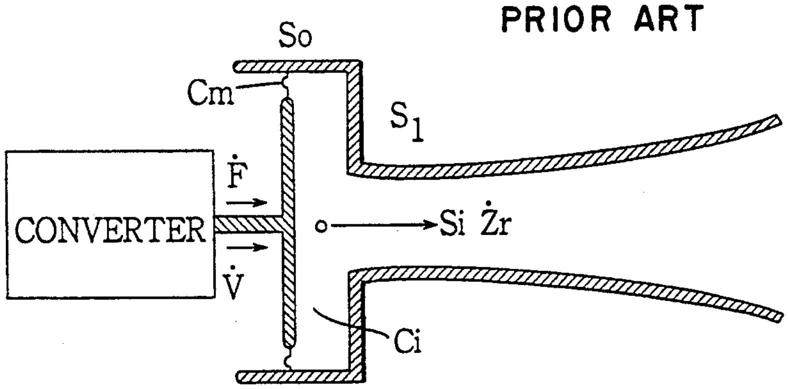
FIG.8 a PRIOR ART
FIGS. 8a and 8b show a basic construction of a conventional horn loudspeaker and an equivalent circuit of a mechanical system thereof, respectively.
Figure 8:
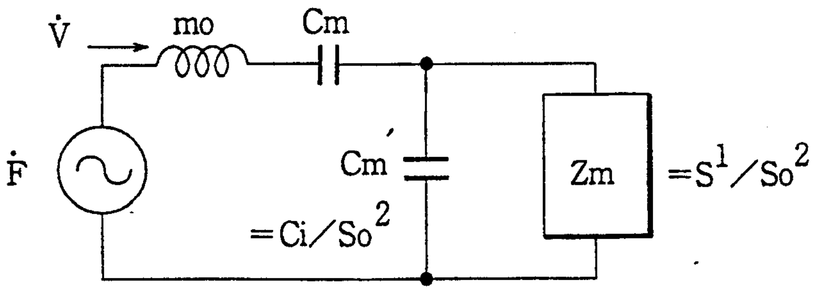
FIG.8 b PRIOR ART
Figure 9:
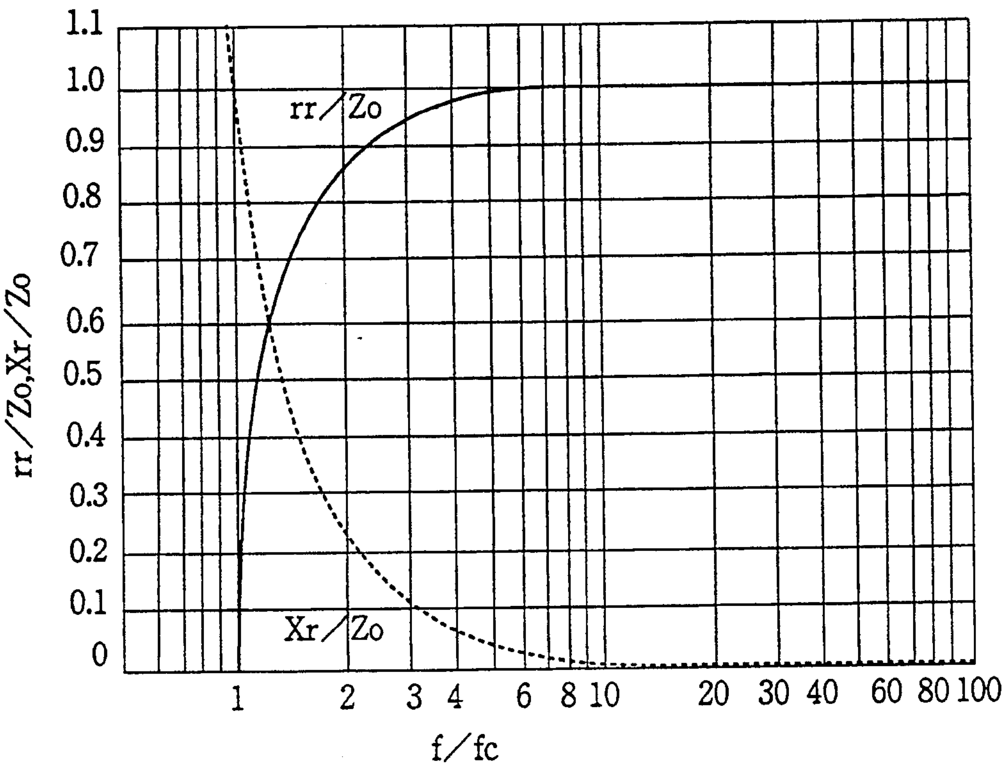
FIG.9 PRIOR ART
FIG. 9 is a graph showing frequency response of radiation impedance for unit area of a conventional exponential horn speaker.
Figure 10:
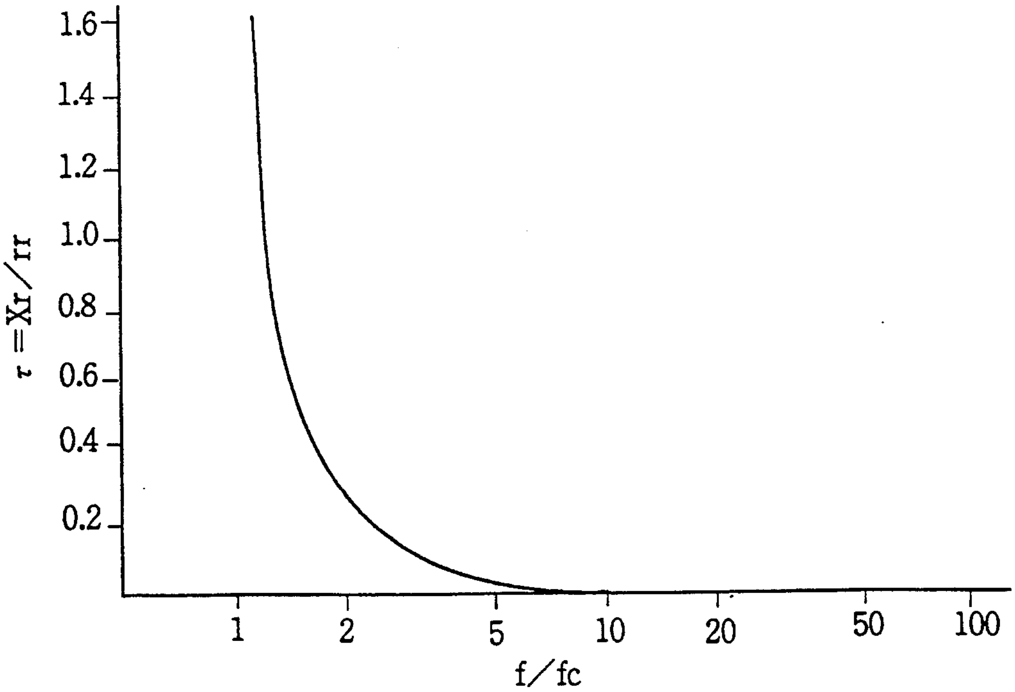
FIG.10 PRIOR ART
FIG. 10 is a graph showing relaxation time $\tau$ with respect to acoustic impedance for unit area in the exponential horn speaker of FIG. 9.

Referring to FIGS. 7a and 7b, showing another embodiment of the present invention, a conical horn 2A is provided with four holes 8b, 8c, 8d and 8e, each equidistantly disposed. Each of the lengths(m) L1 to L4 of the respective holes 8b to 8e, which is set in accordance with the equation (1), is different, depending on the frequency of the sound pressure of which is to be decreased. Each of the holes 8b to 8e is connected to a screw hole 14 formed in the horn 2A. A driver 16 is fixed to the horn 2A through screws 15 in the screw holes 14.

In the present embodiment, the attenuating range of the sound pressure level is further extended so that the sound quality is improved. The holes 8b to 8e also serve as inlets of screws for fixing the driver 16, so that the present invention is easily applied to a conventional horn speaker. Since the absorbent 11 is already provided, it is not necessary to close the inlet of the screw hole with additional means for preventing the deterioration in sound quality, which were used in a conventional speaker.

From the foregoing it will be understood that, in accordance with the present invention, a cutoff frequency of a horn speaker is set to approximate a frequency, the sound pressure of which is to be decreased, by determining the length of the duct provided in a horn. Thus, the sound pressure levels of frequencies approximate the cutoff frequency are reduced and the sound source is preferably localized adjacent the throat of the horn. As a result, the sound quality is improved and the sound source position is stabilized.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A horn loudspeaker having at least one opening formed in a wall of a horn, comprising: at least one duct is formed on said honor, said duct is communicated with said opening and extended in an axial direction of said loudspeaker from said opening to a rear closed end, a length L of the duct is expressed as, $$L \simeq c/4fr - 0.4d$$

where c is a velocity of sound, fr is a frequency of a sound pressure of which is to be reduced, and d is an inner diameter of the duct.

2. A horn loudspeaker according to claim 1, wherein said frequency fr is set to approximate to a cutoff frequency in a low frequency range of said loudspeaker.

3. A horn loudspeaker according to claim 1, wherein said duct is filled with a sound absorbent.

4. A loudspeaker has a plurality of ducts, each duct has a length different from other ducts for another frequency.

5. A horn loudspeaker according to claim 1, wherein said duct is curved along said horn.

6. A horn loudspeaker according to claim 1, wherein said duct is parallel with an axis of said loudspeaker.

* * * * *